(12) United States Patent
Schacht et al.

(10) Patent No.: US 7,074,528 B2
(45) Date of Patent: Jul. 11, 2006

(54) EFFECTIVE ASSIST PATTERN FOR NESTED AND ISOLATED CONTACTS

(75) Inventors: Jochen Schacht, Dresden (DE); Uwe Paul Schroeder, Dresden (DE); Benjamin Szu-Min Lin, Hsinchu (TW)

(73) Assignee: Infineon Technologies AG (DE)

( * ) Notice: Subject to any disclaimer, the term of this patent is extended or adjusted under 35 U.S.C. 154(b) by 227 days.

(21) Appl. No.: 10/739,423

(22) Filed: Dec. 18, 2003

(65) Prior Publication Data

US 2005/0136336 A1    Jun. 23, 2005

(51) Int. Cl.
*G01F 9/00*   (2006.01)
(52) U.S. Cl. .......................................... 430/5
(58) Field of Classification Search ................ 430/5, 430/311, 394; 716/19–21
See application file for complete search history.

(56) References Cited

U.S. PATENT DOCUMENTS

| | | | |
|---|---|---|---|
| 6,852,453 B1 * | 2/2005 | Wu | 430/5 |
| 2003/0198872 A1 * | 10/2003 | Yamazoe et al. | 430/5 |

* cited by examiner

*Primary Examiner*—S. Rosasco
(74) *Attorney, Agent, or Firm*—Brinks Hofer Gilson & Lione

(57) ABSTRACT

A photomask with desired illumination conditions can be constructed by combining a base pattern of openings with an assist pattern which includes openings that are offset from respectively corresponding openings of the base pattern by a preset angular distance.

30 Claims, 10 Drawing Sheets ical evolution EFFECTIVE ASSIST PATTERN FOR NESTED
AND ISOLATED CONTACTS

FIELD OF THE INVENTION

This invention relates generally to photolithography and, more particularly, to an assist pattern which improves the printing of contact holes by a photomask.

BACKGROUND

Photolithography involves transferring patterns of small features by passing light through a mask onto a light sensitive surface. When photolithography is used to create nested lines and spaces that are close together and repeating, the passage of light through the photomask can create diffraction effects that distort the pattern transferred. Diffraction is the bending of light as it passes through a slit or by an obstruction that is physically the approximate size of, or smaller than, the light's wavelength. The diffraction effects that occur as a result of light passing through a photomask are dependent on the spatial frequency of the photomask's features.

Spatial frequency is the number of times a mask feature is repeated in a given space. Spatial frequency is the inverse of pitch. As shown in FIG. 1, a photomask with a square grid has a spatial frequency that differs depending on the axis used for measurement. When the spatial frequency of the square grid is measured parallel to the sides of the square, the spatial frequency is equal to 1/p. The variable p is the length of one side of a square, which is also the pitch in this case. However, when the spatial frequency is measured along the diagonal of the square grid, the spatial frequency is equal to 1/(1.414*p). The pitch is equal to 1.414*p, or the length of a diagonal of one of the square features in the grid. Thus, the pitch and the spatial frequency of a photomask with a square grid are different when measured along the diagonal, causing anisotropic optical diffraction behavior.

For these reasons, it is difficult to lessen the diffraction effects of a photomask with a square grid because there is more than one spatial frequency to consider. The present invention provides an assist pattern to mitigate the anisotropic optical diffraction behavior. The assist pattern includes additional holes in the photomask which are angularly offset from corresponding holes of a base pattern.

BRIEF DESCRIPTION OF FIGURES

FIG. 8 is a top view of a photomask generated according to exemplary embodiments of the invention.

DETAILED DESCRIPTION

Figure 2:
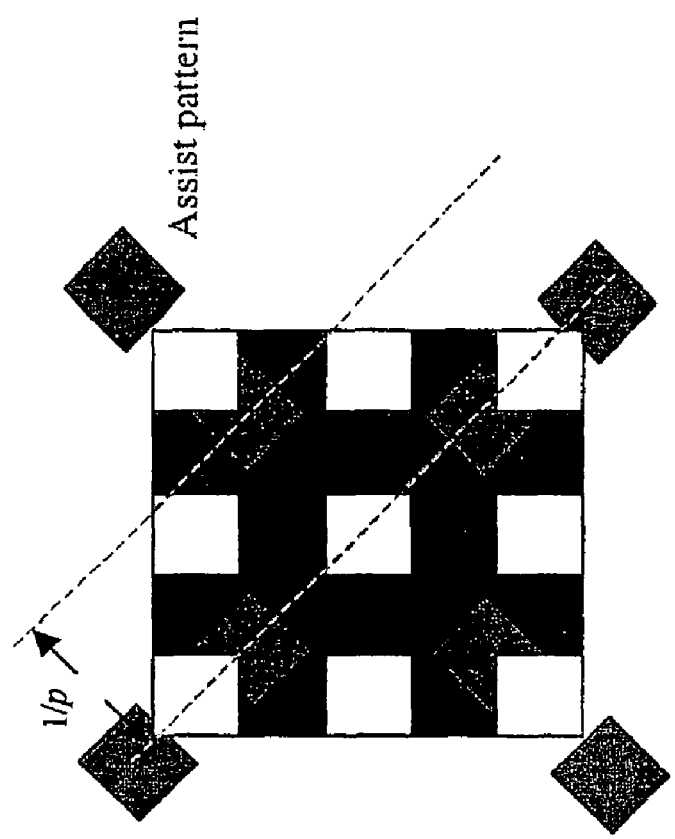
FIG. 2 is a top view of a portion of a photomask according to the invention having a square grid and a superimposed assist pattern.
Figure 1:
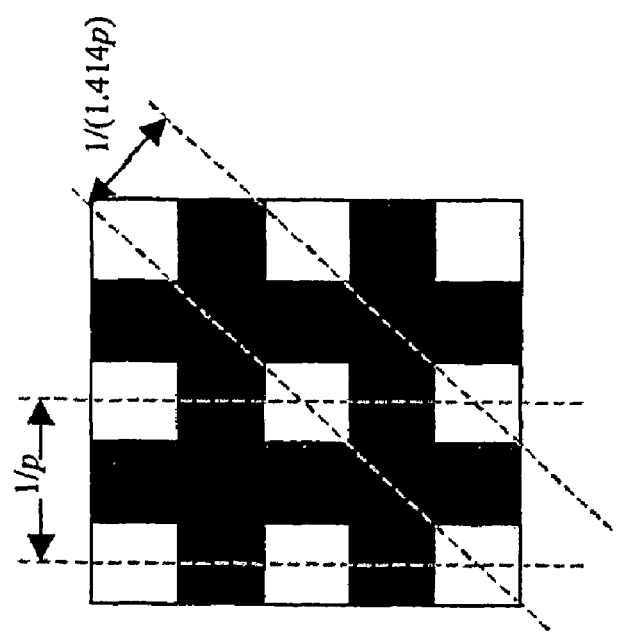
FIG. 1 is a top view of a portion of a conventional photomask having a square grid.

The current invention pertains to an assist pattern for use in conjunction with a base pattern in a photomask, for example a base pattern of nested contact holes. The assist pattern includes contact holes corresponding to the nested contact holes, but which have been "rotated" relative to a central vertex point of the base pattern. As shown in FIG. 2, the assist pattern contact holes (shaded) have a spatial frequency of 1/p when measured along the diagonal axis of the square grid. Thus, the assist pattern helps equalize the variable spatial frequency of the photomask. According to exemplary embodiments of the invention, contact holes of the assist pattern are angularly offset from respectively corresponding contact holes of the base pattern. In other examples, some of the contact holes of the assist pattern are decreased in size relative to the corresponding contact holes of the base pattern. In further examples: some of the angularly offset contact holes are rotated about their own central axes so that their geometric orientations relative to the vertex point differ from those of their corresponding contact holes in the base pattern; some of the angularly offset contact holes are radially offset from the vertex point by different amounts than are their corresponding contact holes in the base pattern; and some of the angularly offset contact holes are both rotated and radially offset relative to the corresponding contact holes in the base pattern.

Figure 3:
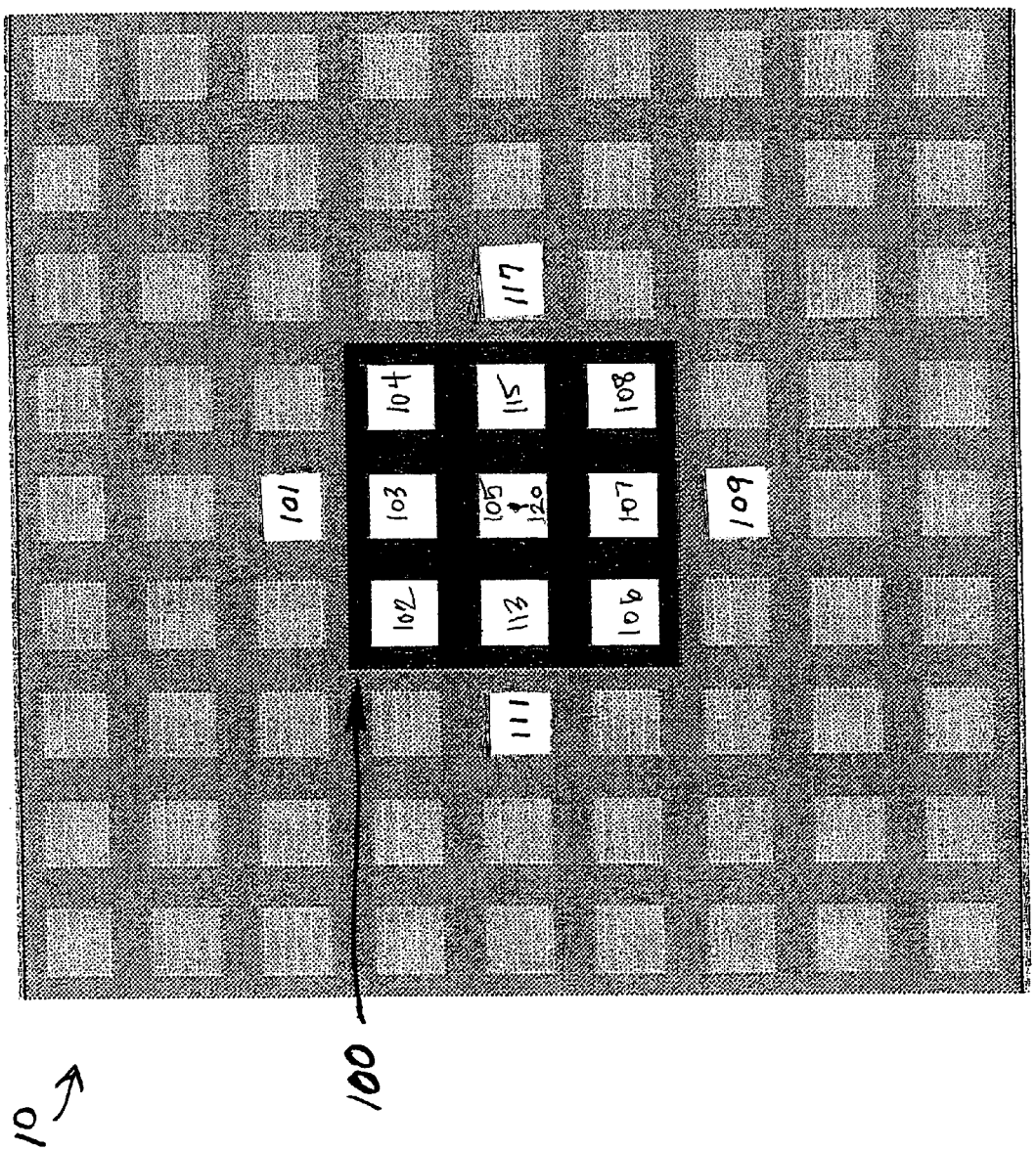
FIG. 3 is a top view of a conventional photomask including 3×3 patterns of nested contact holes.

An example of a photomask 10 having a square grid is shown in FIG. 3. The photomask 10 may be of any size. FIG. 3 shows a base pattern 100 of 3×3 nested contact holes. The assist pattern can be conceptually understood as a rotation of the base pattern 100, together with four additional contact holes, around a central vertex 120. In particular, the "rotated" assist pattern openings will correspond to the contact holes 101, 102, 103, 104, 105, 106, 107, 108, 109, 111, 113, 115, and 117.

Figure 4:
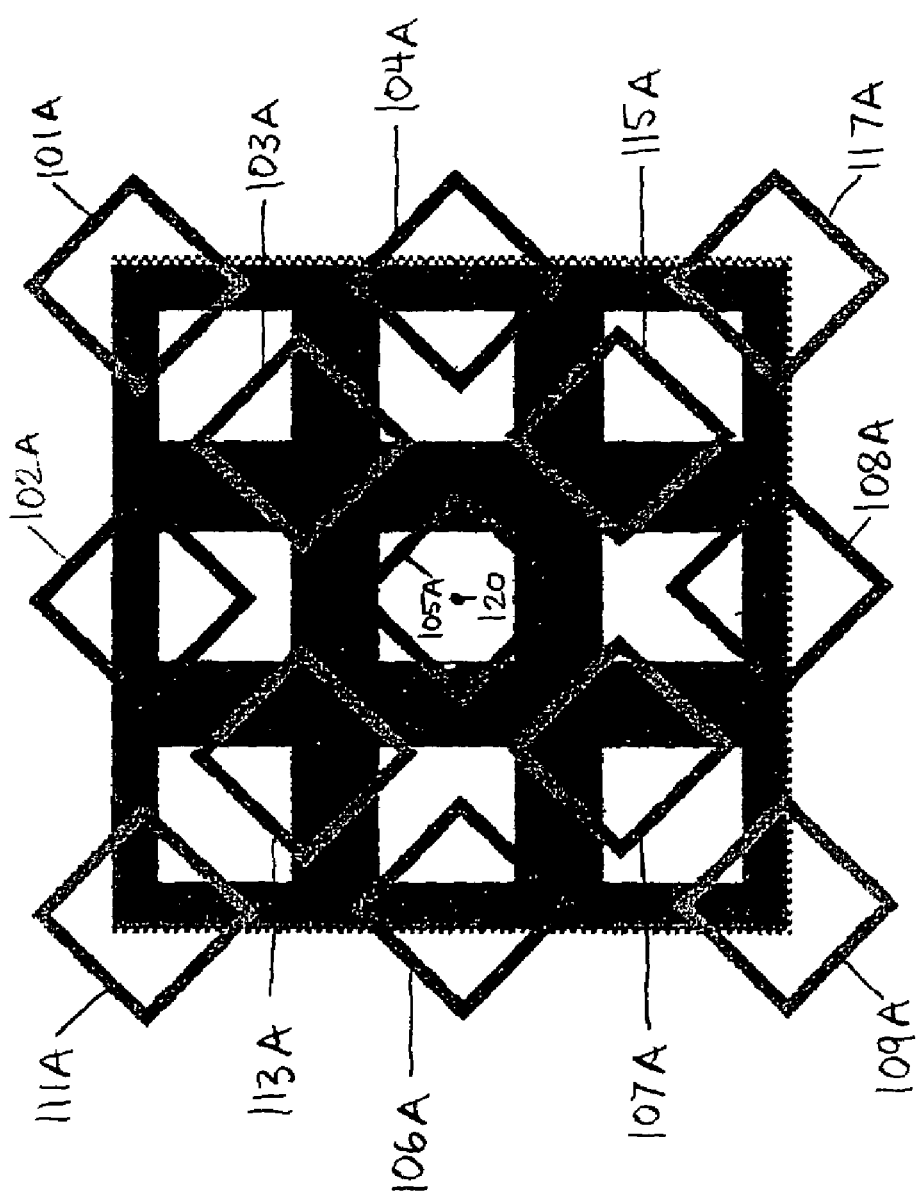
FIG. 4 is a top view of a photomask having a result pattern generated according to exemplary embodiments of the invention by combining a base pattern of 3×3 nested contact holes with an assist pattern.

FIG. 4 shows an example of a result pattern produced by combining a "rotated" assist pattern with the base pattern 100. In this particular example, the assist pattern includes the thirteen contact holes numbered 101A, 102A, 103A, 104A, 105A, 106A, 107A, 108A, 109A, 111A, 113A, 115A, and 117A which respectively correspond to contact holes 101, 102, 103, 104, 105, 106, 107, 108, 109, 111, 113, 115, and 117 in FIG. 3. The assist pattern is rotated 45° (around central vertex point 120) relative to the base pattern.

Figure 5:
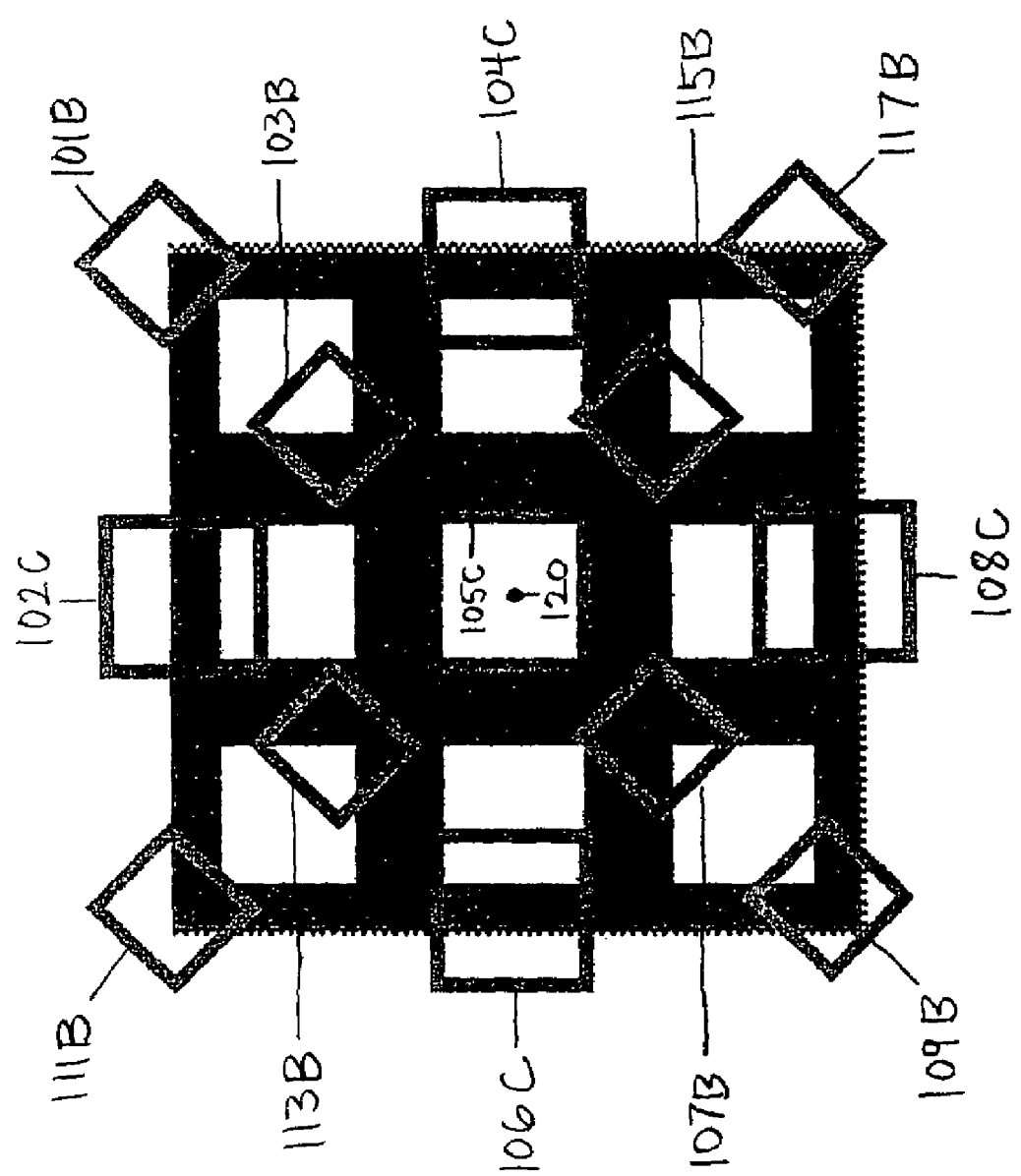
FIG. 5 is a top view of a photomask having a result pattern generated according to further exemplary embodiments of the invention by combining a base pattern of 3×3 nested contact holes with an assist pattern.

According to exemplary embodiments of the invention, the assist pattern openings can be designed to further improve illumination conditions and restore periodicity. Some of the assist pattern openings may be resized or rotated, as shown in FIG. 5. In this example, the openings 101B, 103B, 107B, 109B, 111B, 113B, 115B, and 117B along the diagonals of the assist pattern are reduced in size relative to the base pattern contact holes. In some embodiments, the reduced-size openings are sized such that the lengths of their diagonals are equal to the lengths of the sides of the base pattern contact holes. For example, if the original contact holes of the base pattern measure 220 nm×220 nm, then the aforementioned reduced-size openings measure 155.6 nm×155.6 nm and have a diagonal of 220 nm.

In some embodiments shown in FIG. 5, the assist pattern openings 102C, 104C, 105C, 106C, and 108C positioned horizontally and vertically in the assist pattern are rotated 45° relative to the corresponding openings at 102A, 104A, 105A, 106A, and 108A in FIG. 4, so that their sides are parallel to the sides of the contact holes of the base pattern 100. Thus, the openings 102C, 104C, 106C, and 108C have geometric orientations relative to the central vertex point 120 that differ from those of the corresponding base pattern contact holes 102, 104, 106, and 108 (see also FIG. 3). The central opening 105C completely overlaps the central contact hole 105 of the base pattern 100 and, in essence, disappears.

Figure 6:
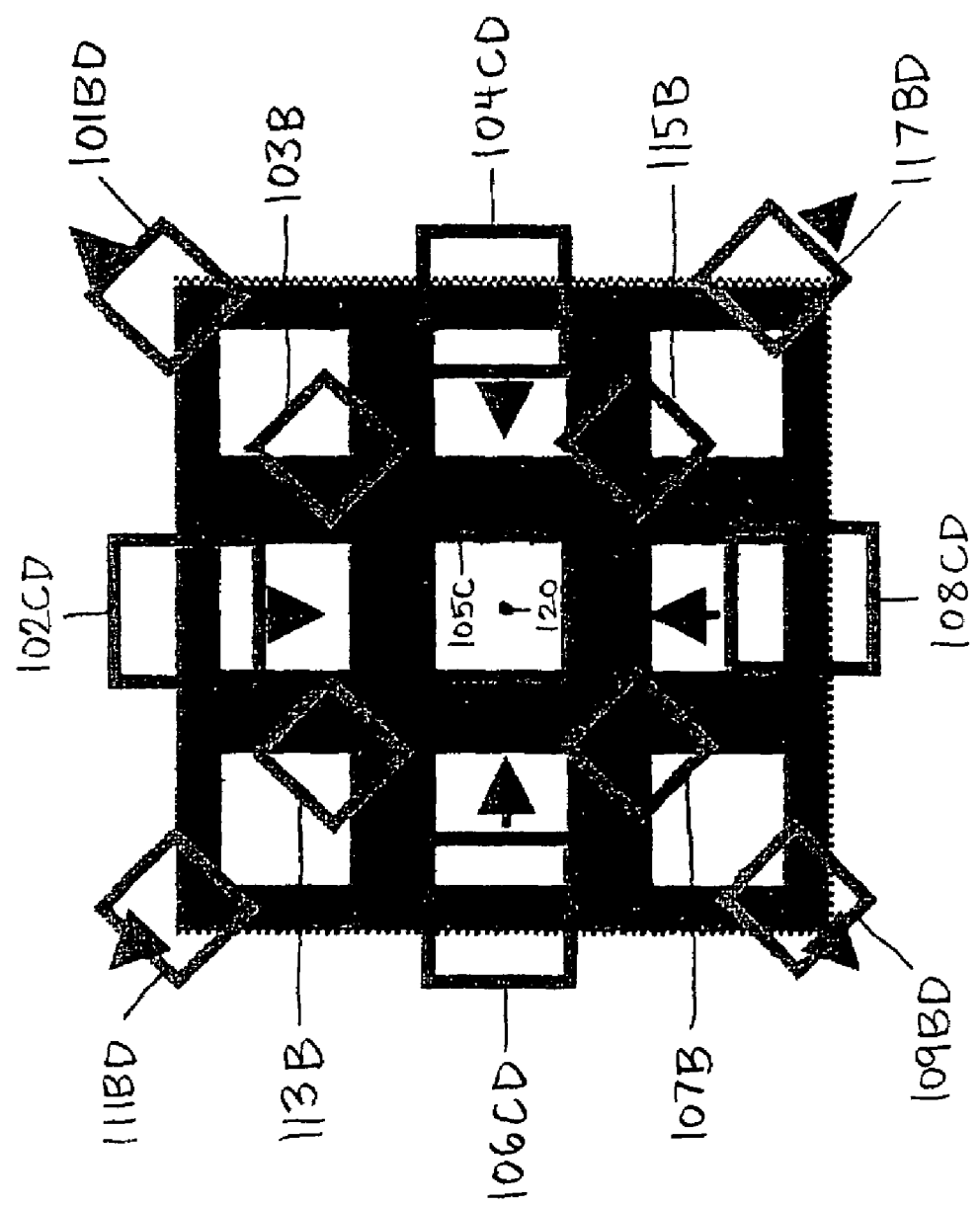
FIG. 6 is a top view of a photomask having a result pattern generated according to further embodiments of the invention by combining a base pattern of 3×3 nested contact holes with an assist pattern.

Additional exemplary embodiments of the assist pattern are illustrated in FIG. 6. The openings 101BD, 117BD, 109BD, and 111BD at the corners of the assist pattern are radially further from the central vertex point of the base pattern 100 than are the corresponding openings 101B, 117B, 109B, and 111B of FIG. 5. In some embodiments, the openings 101BD, 117BD, 109BD, and 111BD are positioned with their center points at the corners of the base pattern 100. In addition, the openings 102CD, 104CD, 106CD, and 108CD are radially closer to the central vertex point 120 of the base pattern 100 than are the corresponding openings of FIGS. 3–5. The openings 102CD, 104CD, 106CD, and 108CD can, in some embodiments, be angularly aligned with and radially outwardly offset 20 nm from respective contact holes 103, 115, 113, and 107 of the base pattern 100 (see also FIG. 3).

Figure 7:
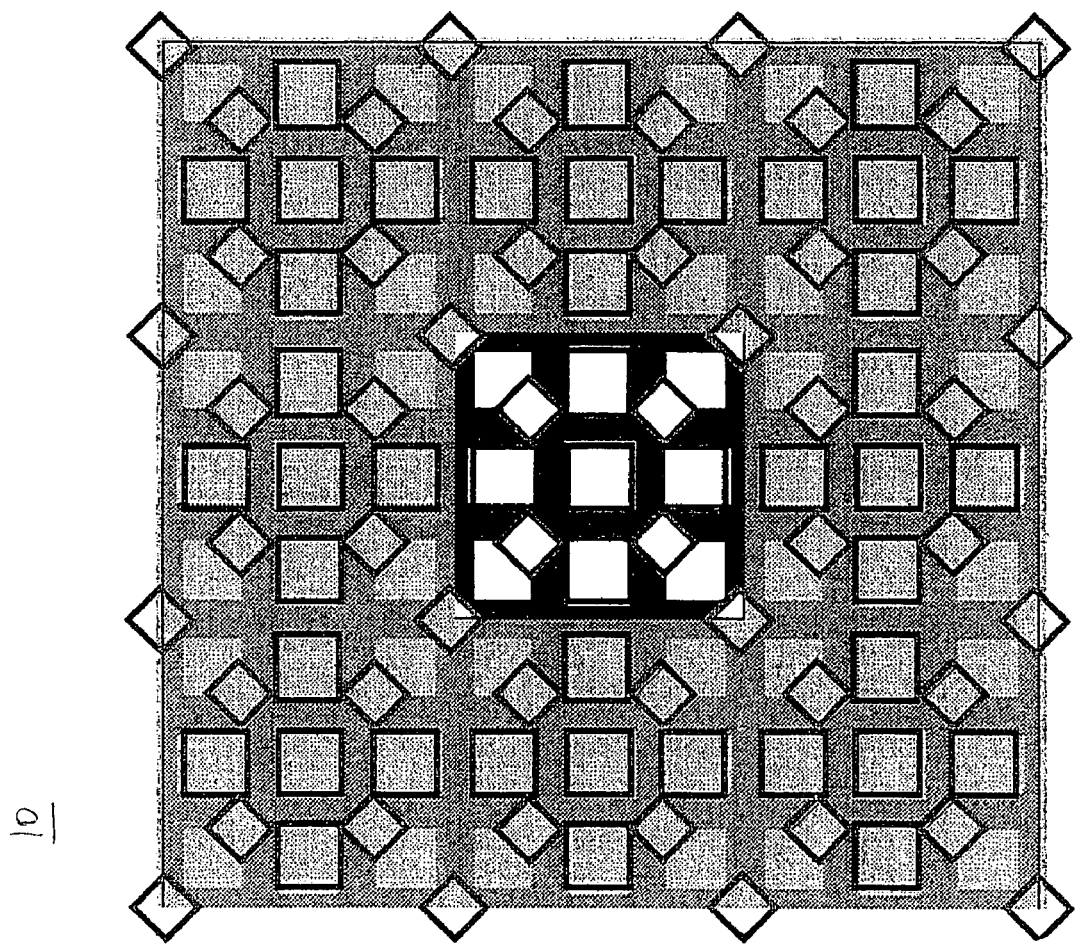
FIG. 7 is a top view of a photomask with a superimposed assist pattern generated according to exemplary embodiments of the invention.
Figure 6:
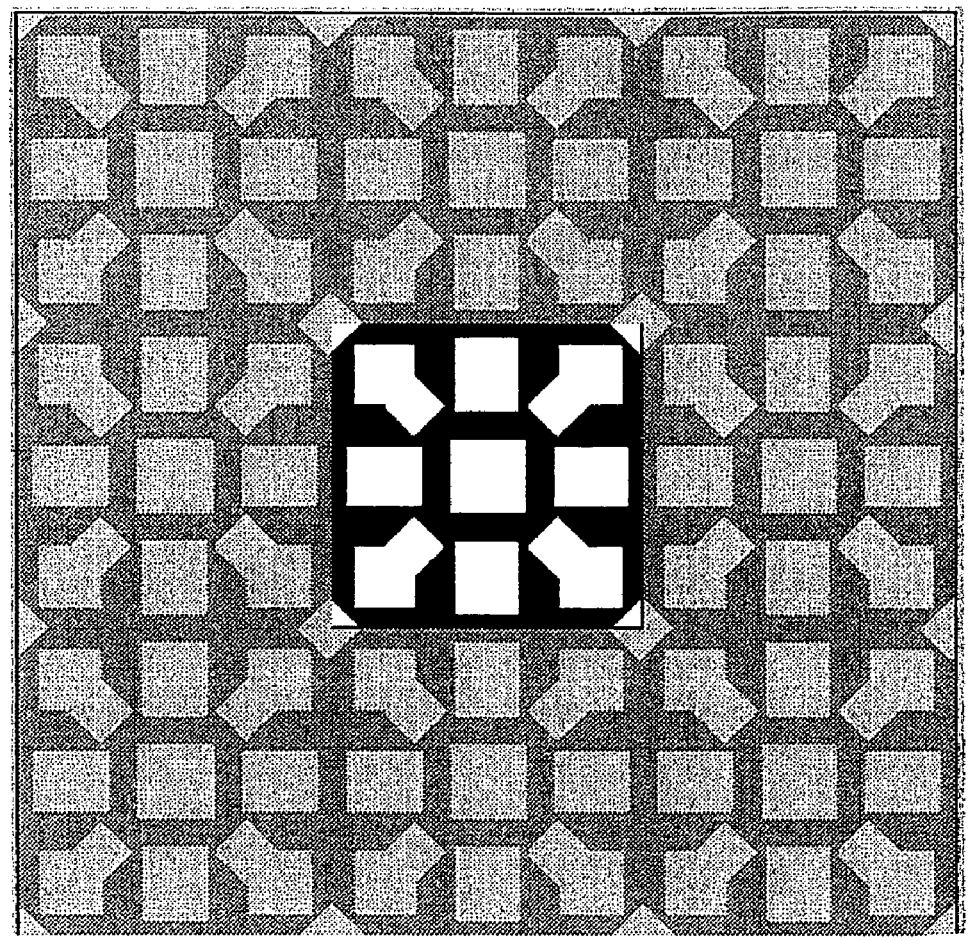

FIG. 7 shows an example of a generated assist pattern superimposed upon the original photomask 10. The features of the assist pattern, generated in this example for each of a plurality of 3×3 base patterns as described above, create a regular, repeating pattern with respect to the square grid of the photomask 10. FIG. 8 illustrates an example of the final appearance of a photomask including the original base pattern and the assist pattern.

Figure 9:
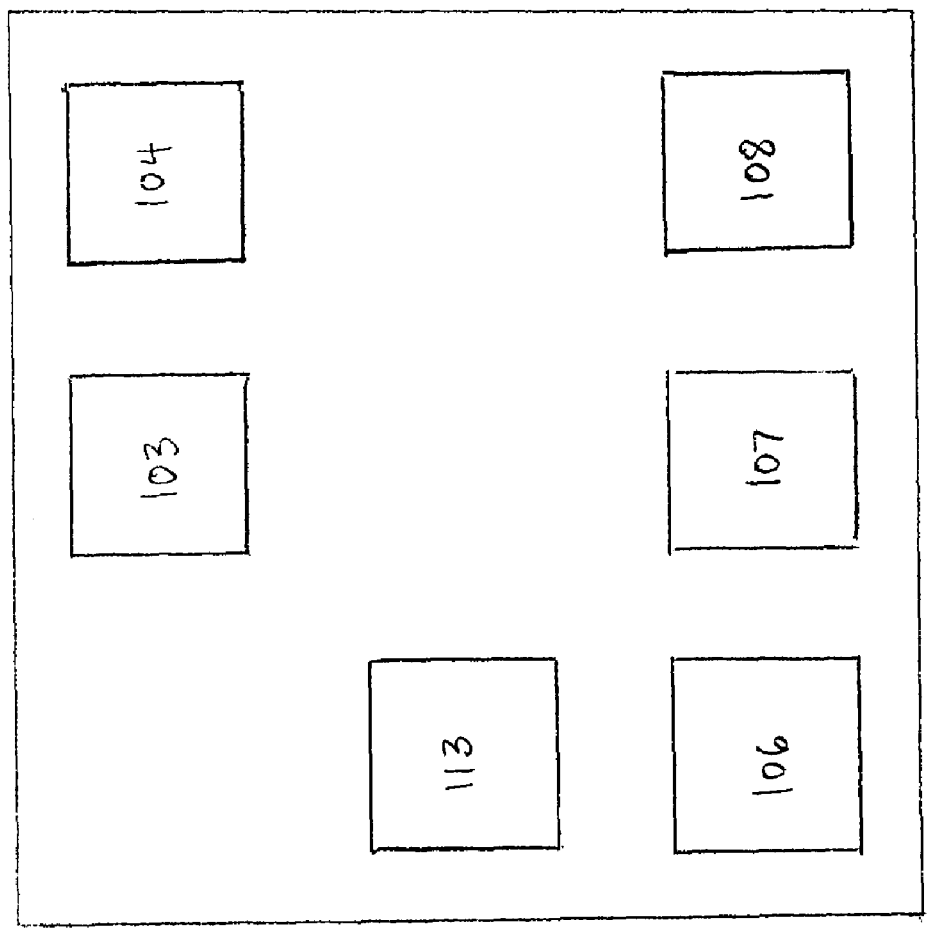
FIG. 9 is a top view of a base pattern of contact holes in a photomask.

A similar assist pattern (see e.g. FIG. 10) may be generated for photomasks having any distribution of contact holes. FIG. 9 shows an example of a base pattern 200 of contact holes, similar to above-described base pattern 100, but having three less contact holes. In order to generate the assist pattern in some embodiments, consider the same thirteen openings shown in FIG. 4, but superimposed on the base pattern 200. The FIG. 4 assist pattern openings which would overlay the three "missing" contact holes, namely assist pattern openings 104A, 105A, 111A, and 113A, are reduced to the size of, e.g. opening 113B in FIGS. 5 and 6. Hence, openings 104A and 105A from FIG. 4 become reduced-size openings 104B and 105B in FIG. 10, while the other openings of the FIG. 10 assist pattern can be sized, positioned and geometrically oriented as shown in FIG. 6.

Figure 10:
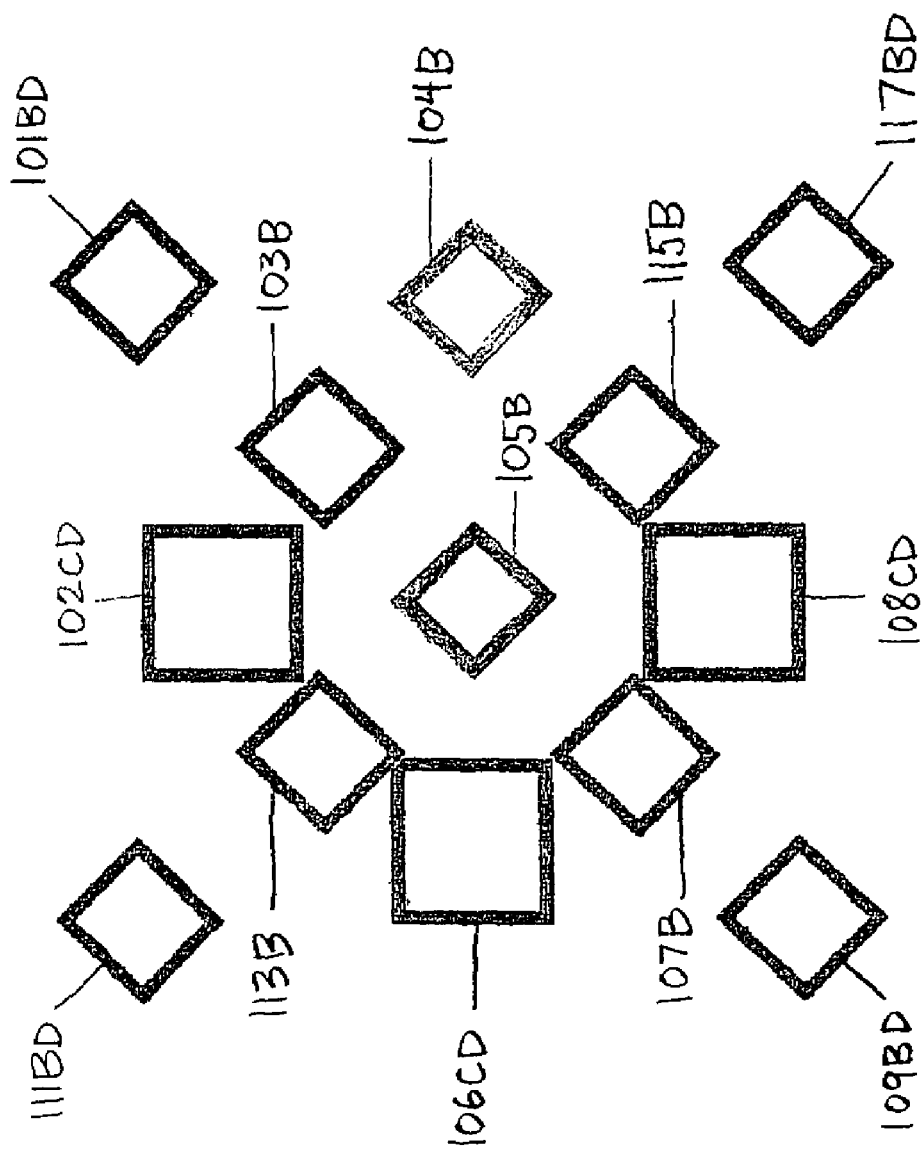
FIG. 10 is a top view of an assist pattern generated according to the invention relative to the base pattern of FIG. 9.
Figure 11:
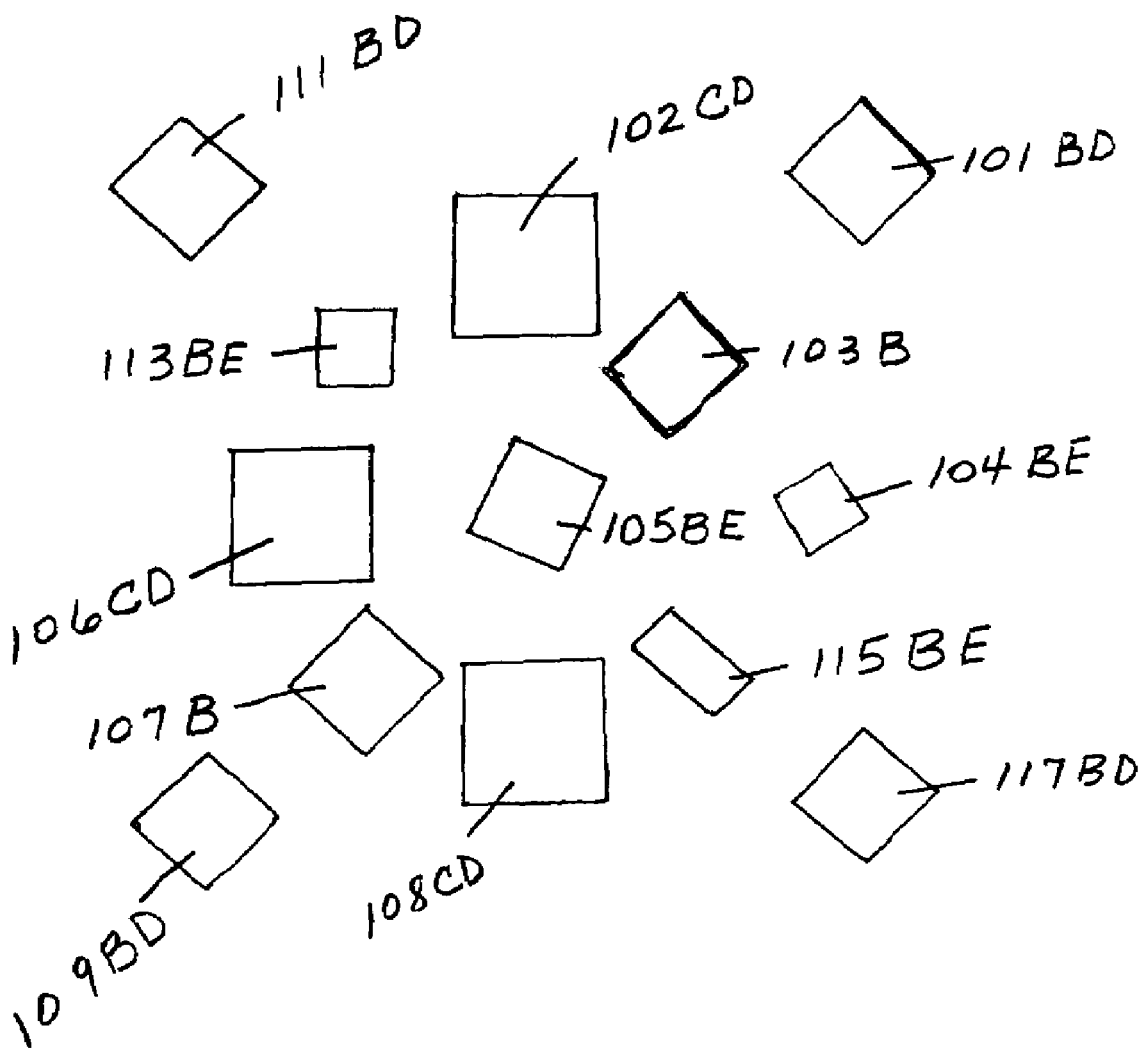
FIG. 11 is similar to FIG. 10 but illustrates further variations in the size, shape and rotation amount of the assist pattern openings.

FIG. 11 is generally similar to FIG. 10, but illustrates exemplary embodiments including further variations in the size, shape and rotation amount of the assist pattern openings. Referring also to FIG. 10, the assist pattern openings 104BE, 105BE, 113BE and 115BE each differ in some respect from the corresponding assist pattern openings 104B, 105B, 113B and 115B of FIG. 10. The opening 113BE is smaller and rotated relative to the opening 113B, the opening 105BE is rotated relative to the opening 105B, the opening 104BE is smaller than and rotated relative to the opening 104B, and the opening 115BE has a rectangular but non-square shape, in contrast to the square shape of the corresponding opening 115B.

In various exemplary embodiments, the assist pattern may be constructed in variable sizes and to allow varying amounts of light transmission and phase shift. As an example, the background material of the photomask can allow 6% of the incoming light to pass through with a phase shift of 180 degrees, the original contact holes of the photomask (base pattern holes) can allow 100% of the light to pass through with no phase shift, and the assist pattern openings of the photomask can allow between 10% and 100% of the light to pass through, with no phase shift.

A photomask having a base pattern and assist pattern according to the invention will have a wider contrast and a larger process window compared to a photomask having only a base pattern. The assist pattern improves the illumination conditions and performance of the photomask by equalizing the spatial frequency, minimizing diffraction, and providing a greater depth of focus.

Although exemplary embodiments of the invention have been described above in detail, this does not limit the scope of the invention, which can be practiced in a variety of embodiments.

What is claimed is:

1. A method of producing a photomask, comprising:
   providing a base pattern of openings in a photomask material; and
   combining the base pattern with an assist pattern of openings in the photomask material to produce a result pattern of openings in the photomask material, the assist pattern including openings that are offset from respectively corresponding openings of the base pattern by a predetermined angular distance greater than 0° and less than 180° relative to a vertex of the base pattern.

2. The method of claim 1, wherein said predetermined angular distance is 45°.

3. The method of claim 1, wherein some of the openings of the assist pattern have respective sizes that respectively differ from sizes of the respectively corresponding openings of the base pattern.

4. The method of claim 3, wherein said some openings of the assist pattern are smaller than the respectively corresponding openings of the base pattern.

5. The method of claim 4, wherein the openings of the base pattern and the openings of the assist pattern have a square geometric shape, and wherein diagonals of said some openings of the assist pattern are equal in length to sides of the respectively corresponding openings of the base pattern.

6. The method of claim 3, wherein one of said some openings is angularly offset from another of said some openings relative to said vertex.

7. The method of claim 3, wherein one of said some openings is radially aligned with another of said some openings relative to said vertex.

8. The method of claim 1, wherein some openings of the assist pattern have the same geometric shapes as the respectively corresponding openings in the base pattern, and wherein said some openings have respective geometric orientations relative to the vertex which respectively differ from geometric orientations of the respectively corresponding openings of the base pattern relative to the vertex.

9. The method of claim 8, wherein said some openings of the assist pattern are radially offset from the respectively corresponding openings of the base pattern by a predetermined distance relative to said vertex.

10. The method of claim 9, wherein said some openings are offset radially inwardly from the respectively corresponding openings of the base pattern.

11. The method of claim 9, wherein one of said some openings is angularly offset from another of said some openings relative to said vertex.

12. The method of claim 1, wherein some of the openings of the assist pattern are radially offset from the respectively corresponding openings of the base pattern by a predetermined distance relative to said vertex.

13. The method of claim 12, wherein said some openings are radially inwardly offset from the respectively corresponding openings of the base pattern.

14. The method of claim 12, wherein said some openings are radially outwardly offset 20 nm from respective openings of the base pattern that respectively overlap said some openings in the result pattern.

15. The method of claim 1, wherein some of said openings of the assist pattern are offset by said predetermined angular distance relative to said vertex from respectively corresponding further openings in the photomask material.

16. The method of claim 15, wherein said some openings are radially offset from their respectively corresponding further openings by a predetermined distance relative to said vertex.

17. The method of claim 16, wherein said some openings are radially outwardly offset from their respectively corresponding further openings.

18. The method of claim 16, wherein said some openings are smaller than their respectively corresponding further openings.

19. The method of claim 1, including performing said combining step with respect to each of a plurality of said base patterns to produce a plurality of said result patterns in the photomask material.

20. A photomask, comprising:
a background material having provided therein a result pattern of openings; and
said result pattern including a base pattern of openings in said background material combined with an assist pattern of openings in said background material, said assist pattern including openings in said background material that are offset from respectively corresponding openings of the base pattern by a predetermined angular distance greater than 0° and less than 180° relative to a vertex of the base pattern.

21. The photomask of claim 20, wherein said predetermined angular distance is 45°.

22. The photomask of claim 20, wherein some of the openings of the assist pattern have respective sizes that respectively differ from sizes of the respectively corresponding openings of the base pattern.

23. The photomask of claim 22, wherein said some openings of the assist pattern are smaller than the respectively corresponding openings of the base pattern.

24. The photomask of claim 20, wherein some openings of the assist pattern have the same geometric shapes as the respectively corresponding openings in the base pattern, and wherein said some openings have respective geometric orientations relative to the vertex which respectively differ from geometric orientations of the respectively corresponding openings of the base pattern relative to the vertex.

25. The photomask of claim 24, wherein said some openings of the assist pattern are radially offset from the respectively corresponding openings of the base pattern by a predetermined distance relative to said vertex.

26. The photomask of claim 20, wherein some of the openings of the assist pattern are radially offset from the respectively corresponding openings of the base pattern by a predetermined distance relative to said vertex.

27. The photomask of claim 20, wherein some of said openings of said assist pattern respectively correspond to further openings in said background material and are offset from the respectively corresponding further openings by said predetermined angular distance relative to said vertex.

28. The photomask of claim 27, wherein said some openings are radially offset from their respectively corresponding further openings by a predetermined distance relative to said vertex.

29. The photomask of claim 28, wherein said some openings have respective sizes that respectively differ from sizes of the respectively corresponding further openings.

30. The photomask of claim 29, wherein said some openings are smaller than the respectively corresponding further openings.

* * * * *